(12) United States Patent
Allen et al.

(10) Patent No.: US 9,603,260 B2
(45) Date of Patent: Mar. 21, 2017

(54) METHOD AND PRODUCTS RELATED TO DEPOSITED PARTICLES

(75) Inventors: Mark Allen, Espoo (FI); Jaakko Leppäniemi, Espoo (FI); Tomi Mattila, Espoo (FI)

(73) Assignee: Teknologian Tutkimuskeskus VTT Oy (FI)

( * ) Notice: Subject to any disclaimer, the term of this patent is extended or adjusted under 35 U.S.C. 154(b) by 1090 days.

(21) Appl. No.: 13/508,994

(22) PCT Filed: Nov. 15, 2010

(86) PCT No.: PCT/FI2010/050917
§ 371 (c)(1),
(2), (4) Date: Jul. 13, 2012

(87) PCT Pub. No.: WO2011/058230
PCT Pub. Date: May 19, 2011

(65) Prior Publication Data
US 2012/0275119 A1    Nov. 1, 2012

Related U.S. Application Data

(60) Provisional application No. 61/260,914, filed on Nov. 13, 2009.

(30) Foreign Application Priority Data

Nov. 13, 2009 (FI) ...................... 20096179

(51) Int. Cl.
| | | |
|---|---|---|
| *H05K 3/32* | (2006.01) | |
| *H05K 3/38* | (2006.01) | |
| *H05K 3/12* | (2006.01) | |
| *C09D 11/52* | (2014.01) | |
| *B82Y 30/00* | (2011.01) | |
| *H05K 1/03* | (2006.01) | |

(52) U.S. Cl.
CPC ............... *H05K 3/32* (2013.01); *B82Y 30/00* (2013.01); *C09D 11/52* (2013.01); *H05K 1/038* (2013.01); *H05K 3/12* (2013.01); *H05K 3/1283* (2013.01); *H05K 3/38* (2013.01); *H05K 3/125* (2013.01); *H05K 2201/0116* (2013.01); *H05K 2201/0209* (2013.01); *H05K 2201/0284* (2013.01); *H05K 2201/10106* (2013.01); *H05K 2201/10636* (2013.01); *Y02P 70/611* (2015.11); *Y10T 29/4913* (2015.01)

(58) Field of Classification Search
None
See application file for complete search history.

(56) References Cited

U.S. PATENT DOCUMENTS

| | | | |
|---|---|---|---|
| 2006/0003115 A1* | 1/2006 | DeMejo | B41M 5/52 428/32.34 |
| 2006/0189113 A1 | 8/2006 | Vanheusden et al. | |
| 2006/0204684 A1* | 9/2006 | Missell | B41M 5/52 428/32.34 |
| 2008/0008820 A1 | 1/2008 | Kowalski et al. | |
| 2008/0265414 A1 | 10/2008 | Ho et al. | |
| 2009/0258241 A1 | 10/2009 | Shiraishi et al. | |
| 2011/0143051 A1* | 6/2011 | Ohashi | C09D 11/0235 427/553 |

FOREIGN PATENT DOCUMENTS

| | | |
|---|---|---|
| EP | 2001053 | 12/2008 |
| EP | 2001272 | 12/2008 |
| EP | 2003678 | 12/2008 |
| WO | WO2006/076603 | 7/2006 |
| WO | WO2008/009779 | 1/2008 |

* cited by examiner

*Primary Examiner* — Sheeba Ahmed

(57) ABSTRACT

The invention concerns a method of removing encapsulating material from encapsulated particles deposited onto a substrate. According to the method, a substrate is used which is capable of facilitating said removal of encapsulating material. The particles may be nanoparticles. In particular, the substrate-facilitated removal may result in sintering of the particles. The invention provides a novel way of functionalizing electronic structures using particulate matter and for conveniently producing e.g. printed electronics devices.

9 Claims, 8 Drawing Sheets

METHOD AND PRODUCTS RELATED TO DEPOSITED PARTICLES

FIELD OF THE INVENTION

The invention relates to encapsulated particles deposited on substrates for example for the purposes of printed electronics. In particular, the invention relates to a method of efficiently removing the encapsulating material covering metallic, metal oxide and semiconductor particles deposited on substrates for the purpose of forming functionalized structures. Also, the invention relates to products enabled by removing the encapsulating material and apparatuses suitable for this purpose. The invention provides a method for producing conductors by depositing encapsulated metallic particles on substrates and removing the encapsulating material to enable sintering. The invention provides a method for interconnecting discrete components to the sintered structure. In addition, the invention relates to products produced by sintering and interconnecting of discrete components to the sintered structure.

BACKGROUND OF THE INVENTION

Printed electronic components and devices have been, for the most part, demonstrated on non-absorbing substrates. This way, the physical properties of the printed (and cured) layer are principally determined by the material itself and e.g. substrate surface modifications only target desired wetting behaviour during printing. Contrary to e.g. inkjet photopapers or transparency sheets, these printing substrates require the complete evaporation of the solvent/dispersant rather than drying by absorption. In addition to the removal of the solvent, most particle based inks/pastes typically require a curing step to remove a particle encapsulating material to further enable physical contact between the particles. The encapsulating material is often tightly bonded to the particle cores to provide a stable dispersion by preventing particle aggregation. Therefore, the curing temperature required for the efficient removal of the encapsulant is often challenged by the thermal tolerance of the substrate. This is a problem frequently encountered when attempting to form metallic conductors on flexible substrates by means of printing a dispersion of encapsulated metallic nanoparticles followed by thermal curing to remove the encapsulant to enable sintering. Thereupon, various alternative sintering methods such as laser sintering, pulsed high-energy light sintering, microwave sintering and electrical sintering have been developed. Electrical sintering, for example, is discussed in our earlier patent application publications WO 2008/009779, EP 2001272, EP 2001053, EP 2001273 and EP 2003678.

All known sintering methods have their advantages but they also suffer from certain disadvantages.

The printing of devices and circuit components is still at a technology development stage: process related limitations (e.g. the minimum gap spacing between printed conductors) as much as material limitations (e.g. the stability and mobility of organic semiconductors) persist regardless of the efforts of the scientific community and industry. Apparently, some pioneered printed electronics processing lines are capable of all-printing fully functional RFID tags, but these typically require expensive equipment and a controlled environment. More mature technologies such as screen printing of silver paste for antenna fabrication have proven competitive, though the integration of the silicon based microchip, or other discrete components, with the printed circuitry (antenna) is a costly process stage. A typical method used for forming the interconnection is flip-chip bonding (pick-and-place) although other methods such as fluidic and vibratory assembly have been introduced. The generic problem with interconnecting components to the printed circuitry is how to deliver a discrete component to the precise location (aligned to the printed contact pads) in a high throughput manner. An additional challenge related to flip-chip bonding to (nanoparticle ink) inkjet printed and sintered wiring is the electrically insulating layer that tends to form on the top surface of the sintered conductor.

Thus, there is a need for an efficient method for removing the encapsulating material from deposited particles to expose the particle cores in particular for the purposes of conductor forming, component interconnecting, forming sensor materials and promoting the sintering of metal oxide and semiconductor particles. A process method and apparatus, by which even large-scale circuits could be fabricated on low-cost substrates by drop-on-demand printing (digitally defined print pattern) and chip-on-demand placing (various different components place at digitally defined component locations with respect to the printed electrodes), would inspire much potential.

SUMMARY OF THE INVENTION

It is an aim of the invention to provide an efficient method for removing the encapsulating material from deposited particles which is, in particular, suitable for the mass-production of electronic circuits, components and/or devices. It is also an aim to provide products enabled by removing the encapsulating material and related apparatuses.

It is also an aim of the invention to provide a method of connecting electrical components.

The aims are achieved by the method, product and apparatus as defined in the independent claims. Advantageous embodiments are the subject of dependent claims.

According to a primary embodiment, the method for removing the encapsulating material is substrate facilitated.

Thus, according to one aspect of the invention, there is provided a method of producing a particulate structure on a substrate from particles having a core and an encapsulating material bonded to the particle core, the method comprising depositing said particles onto the substrate and removing the said encapsulating material from the cores of the particles for exposing the particle cores and bringing the particle cores into physical contact. According to preferred embodiment, a substrate is used which is capable of chemically removing the encapsulating material from the particle core.

A particular aim of the invention is to provide methods suitable for a wide range of substrates.

According to one embodiment, the substrate is arranged, typically by providing one or more coating layers over a base substrate, to be capable of absorbing ink/paste solvent/dispersant rapidly (within a liquid absorbing layer beneath a surface layer) while preventing transporting the particles outside of the targeted areas on the surface layer.

According to a preferred embodiment, the substrate comprises a charged colloidal type porous oxide material (suspension of non-porous particles) in the surface layer to chemically remove the encapsulating material from the particles bringing the particle cores into close contact.

The porous oxide material can, in particular, be mesoporous.

According to one embodiment, the charged colloidal type porous oxide material is nano-alumina or nano-silica, the average particle size being in particular 5-40 nm. The oxide material may also be niobium, tantalum, titanium, zirconium, cerium or tin oxide.

The invention provides a method in which electronic structures are deposited and sintered in situ, on substrates.

Thus, according to one aspect of the invention there is provided a method of producing a sintered structure on a substrate from particles having a core and an encapsulating material bonded to the particle core, the method comprising depositing said particles onto the substrate, and removing the said encapsulating material from the cores of the particles for sintering the particles. According to the invention a substrate is used which is capable of chemically removing the encapsulating material from the particle core in order to sinter the particles to form said sintered structure.

According to one aspect the invention provides an electronics module, typically formed by printing, comprising a substrate (in particular a sheet or web substrate), and a sintered structure on said substrate, the sintered structure being formed from at least partially fused particle cores. According to the invention, the substrate is capable of chemically removing the encapsulating material from said particle cores in order to sinter the particles to form said sintered structure.

The invention also presents a related processing method, where even large-scale circuits can be fabricated on low-cost substrates by drop-on-demand printing (digitally defined print pattern) and chip-on-demand placing (various different components places at digitally defined component locations with respect to the printed electrodes).

According to one embodiment, a topmost substrate layer capable of removing the encapsulating material as the ink solvent is absorbed is used for connecting one or more discrete electrical components to the substrate. The ink/paste particles with the encapsulating material removed when deposited on the solvent-absorbing surface provide good electrical and mechanical contacting of the component to the substrate.

In one embodiment of the method, components are placed by first printing the contact pad areas at a slightly higher printing resolution than was used for the conductor patterning, and then dropping the component in the defined location by a momentary break in the vacuum suction flow holding the components in a tower attached to the printhead. As the component contacts the wet ink, the component is instantaneously fixed to the electrodes providing an electrically and mechanically high quality contact. The placement accuracy is limited by the accuracy of the printer's motorized stages.

Thus, the invention also provides an apparatus comprising means for holding or feeding a chemically active substrate of the above kind, a printing head for depositing encapsulated conductive particle-containing ink onto the substrate for forming conductor structures thereon by sintering of the particles, and means for placing discrete electrical components onto a still wet ink for electrically contacting the components with said conductor structures and mechanically affixing the components to the substrate.

The invention provides significant advantages.

The invention provides a method for forming electric circuits and/or components on a wide range of low-cost substrates and a method to attach discrete components to the formed conductors in a cost-effective way. The overall price of such coated substrates is typically less than the price of substrates frequently used in printed electronics, which are typically required to withstand heating and provide a smooth surface.

Compared with traditional sintering methods, involving at least two processing stages (i.e. material application and actual sintering), this invention provides direct sintering on a coated base substrate even without a post-processing stage. By coating the substrates as described in this invention, the method enables sintering on a wider range of low-cost printing substrates than has previously been possible. The method provides processing of printed electronics as one-step printing and sintering implying savings in time and yield.

Also the insulating barrier formation problem related to flip-chip bonding to inkjet-printed and thermally sintered wiring is overcome with the presently disclosed substrate facilitated sintering method. Thus, the present invention provides a method to directly attach discrete components to the printed conductors during printing in an extremely cost-effective way.

By a "substrate facilitated" method we mean that the substrate is alone capable of initiating the removal process of the encapsulating material of the particles deposited onto the substrate. In particular, the substrate is capable of removing at least 25% of the encapsulating material at room temperature. It is also possible that the encapsulating material is removed by the substrate-facilitated process entirely. After partial or full removal of the encapsulation layer, the sintering process may start either spontaneously or by focusing external energy to the system.

The term "in situ sintering" means, in particular, that the sintering takes place, at least partially, without external energy brought to the system after deposition. However, it must be noted that the invention is not limited to such methods where external energy is not brought to the system, but the invention covers widely all such methods where the substrate and particle ink are capable of providing the described sintering effect, at least to some level, in situ. In other words, additional sintering (or "curing") using e.g. heat, light or electrical current is not excluded and has, in fact, found to further increase the conductivity of the surface.

When producing conductors for printed electronics circuits, the desired conductivity level after substrate facilitated sintering is typically above 1e6 S/m, which can be well produced by the present method as will be shown later.

In particular, by means of the invention, structures with electrical conductivity higher than 1%, suitably higher than 10%, and even higher than 25% of the bulk conductivity of the metal used as the core of the particles can be produced, even without additional curing.

The resulting conductivity may also be tuned by choosing an applicable encapsulating material and by adjusting the thickness of the encapsulating layer covering the particles. Thus, various different ink/paste dispersions may be printed simultaneously onto the same coated substrate to enable conductors and resistors with different targeted conductivity/resistance.

The term "(encapsulating) material" refers to any material with molecules capable of being bonded (e.g. by covalent, ionic or hydrogen bonds, or by e.g. van der Waals or ion-dipole interaction) to the particle core material and capable of preventing coagulation, entanglement or fusing of the particles. The encapsulating material may form a capping or coating layer having a thickness preferably in the range of 0.1-5 nm, in particular 0.1-1 nm.

The encapsulating material is preferably organic.

The particles are preferably nanoparticles, typically spherical nanoparticles. Thus, their diameter is less than 1000 nm, preferably less than 100 nm. Best in situ sintering results have been observed with particles having a size between 5 and 50 nm.

The ink/paste receptive coating layer may be patterned only to predetermined locations on the substrate to provide location dependent ability to chemically remove the encapsulating material.

Next, embodiment of the invention are described more closely with reference to the attached drawings.

DETAILED DESCRIPTION OF EMBODIMENTS

Figure 1:
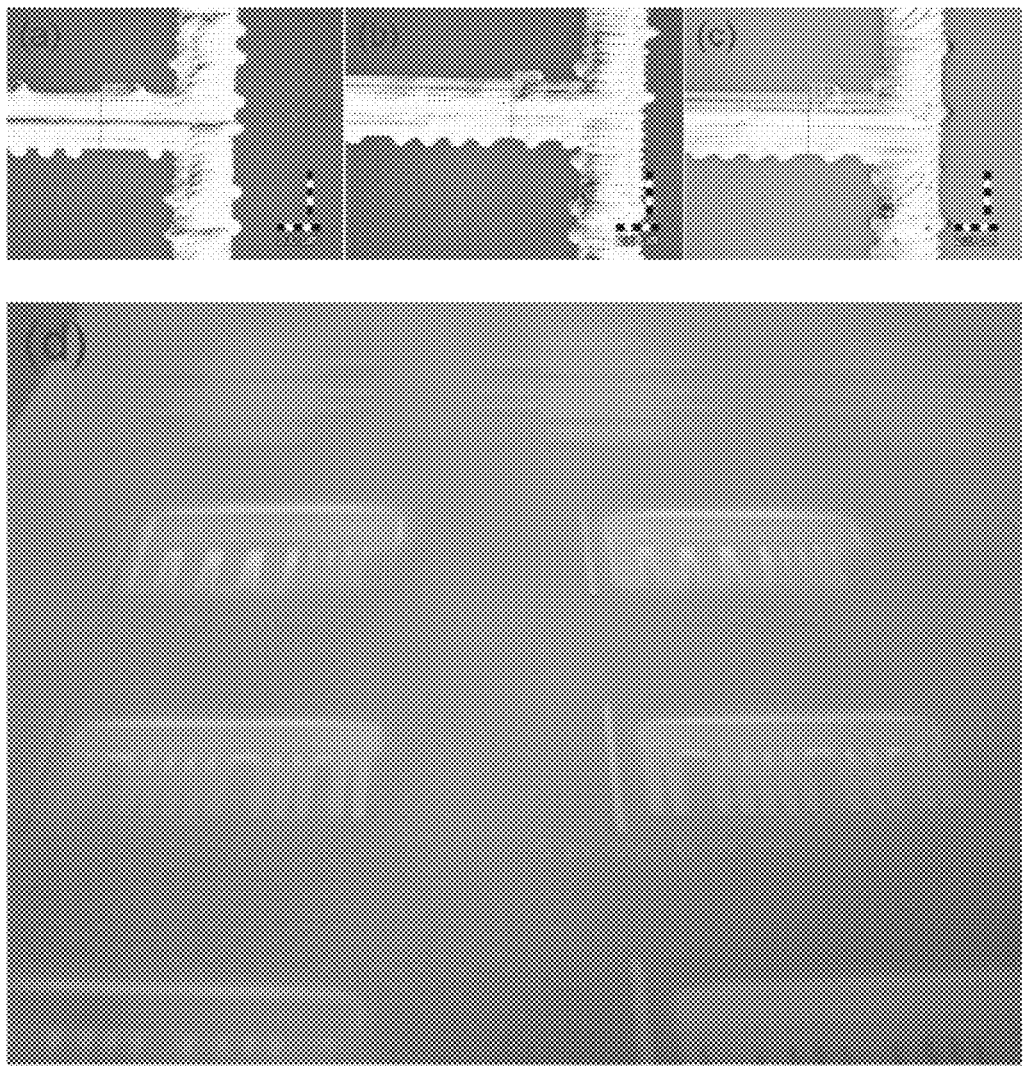
FIG. 1. Inkjet printed silver patterning on (a) Siena photopaper (b) Epson Premiun Glossy photopaper (c) Epson transparency. (d) The absorbed solvent is visible directly after printing providing evidence of particle fixation in the surface layer while the solvent is pulled to an underlying layer.

The described invention relates to substrate facilitated removal of the encapsulating material from deposited particles on surface modified substrates. The central ink/paste and coating layer properties required to enable the said removal of the particle encapsulating material, as well as practical examples, are described below for allowing the invention to be carried out.

Many base materials, such as paper, plastics, textiles etc. can be coated with the type of acceptor coating layer described in this invention. These materials are inexpensive when compared to uncoated substrates frequently used in printed electronics.

Particle inks/pastes developed for, e.g., printed electronics applications contain particles encapsulated with a capping material forming a coating layer. Particles with a mean particle diameter 1 nm-3 nm, more typically in the range 5-50 nm in the case of nanoparticles, at a narrow size distribution will provide strong attractive van der Waals/Casimir forces so that only a small energy is required for displacing the particle encapsulant and for particle surfaces to get in contact. Preferably, the encapsulating material should have ionic terminating groups to provide electrostatic repulsion in the liquid phase. The encapsulant may generally be e.g a thiol, other sulfur-containing ligand, amine, oxide, phosphine, carboxylate ligand, polyelectrolyte, or polymer (e.g. Poly(N-vinyl-2-pyrrolidone) (PVP) or polyethylene glycol). The gold-sulfur bind is very strong in thiol ligands, while e.g. polymers do not bind as well to the gold resulting in a rather loosely bound encapsulant and are thus, not as good stabilizers. Specifically, the thiol capped nanoparticles can be repeatedly isolated (dried) and redissolved without irreversible aggregation. The particles can be either negatively or positively charged. A non-ionic encapsulating material, such as PVP, can also be used, in which case stability is maintained by virtue of steric hindrance. The ink/paste dispersant can be either polar or non-polar.

The core of the ink/paste particles may comprise e.g. Ag, Au, Cu, Al, Ni, . . . , $SiO_2$, ZiO, $TiO_2$, ITO, AZO, . . . .

The printing substrate preferably comprises at least a surface layer and a liquid absorbing layer on a base substrate. When the ink/paste is deposited on the substrate, the solvent/dispersant will be rapidly absorbed into the substrate liquid absorbing layer while the substrate surface layer will fix the ink/paste particles and chemically remove the particle encapsulating material leaving a tightly packed layer of core exposed particles. The capping layer should be as thin as possible (preferably less than 0.5 nm) to obtain a high packing efficiency upon absorption of the ink solvent. The important physical parameter that determines the nature of the dispersion forces between the nanoparticles is the ratio of the size of the metal core to the interparticle separation distance. In order to obtain high packing efficiency, the capping layer thickness must be small in comparison to the core size (preferably 0.2-5%).

The substrate surface layer should preferably hold a high charge density. Preferably, the surface layer will be structured from homogeneous colloidal type porous oxide particles in the size range 10-150 nm. The substrate should be matched for the ink/paste properties so that the substrate surface layer is oppositely charged with respect to the ink/paste particles. The charge density can be increased by using a highly charged fixation substance as a binder (e.g. PEI in the case that a cationic charge density is desired). Similarly, the binder used in the substrate surface layers should be matched for a polar solvent in the case of a polar ink/paste dispersant and visa versa for a non-polar ink/paste dispersant. E.g. a polar ink/paste solvent/dispersant is required if PVP or PVA is used as the binder in the substrate coating layers.

As discussed above, the mechanism for removing the particle encapsulating material is based on the substrate facilitated chemical removal of the encapsulating material. In particular, a highly charged surface layer of the substrate will attract the encapsulating material molecules and remove the coating if it is energetically favourable. Below, are some example cases:

Encapsulating material incorporating molecules with ionic terminating groups: Dissociation of the encapsulating material from the particle core is accomplished if the ionic binding strength between the terminating group of the encapsulant molecules and the surface layer of the substrate is stronger than the binding strength of the encapsulant molecules to the particle core.

Non-ionic encapsulating material: the attraction force between a molecule without any ionisable groups and the highly charged surface layer of the substrate can arise due to ion-dipole interactions. E.g. polyvinylpyrrolidone (PVP) represents a dipole which is likely to undergo ion-dipole interaction with the charged substrate layer bringing the two components into close contact. Dissociation of the encapsulant molecules will occur if it is energetically favourable to break the PVP-particle bond in order to form the ion-dipole bond with the substrate.

Removal of encapsulating material facilitated by an externally added chemical: the encapsulant molecule—particle core bond breaking process may be facilitated with an external chemical (e.g. water, methanol, ethanol etc.). This substance will aid in dissociating the encapsulant molecule from the particle and transporting to the substrate.

The binding strength of the encapsulating material to the particle core should be minimized within the limits of maintaining high stability as an ink/paste dispersion.

The removal of the encapsulating material from the particles enables for the particles to have direct physical contact. In the case of metallic particles, this procedure enables sintering of the particles. For metallic particles with a large surface-to-volume ratio, the surface atoms having smaller coordination numbers than corresponding inner core (bulk) atoms, the release of high surface energy is the driving force for sintering.

Thus, the described invention relates to in situ substrate facilitated sintering of particles on surface modified substrates and to the direct interconnection of discrete components to the said particle structure. The central ink and coating layer properties facilitating the sintering and interconnection process are as described above. A process environment and apparatus for drop-on-demand printing and chip-on-demand placing is also suggested.

The invention provides an efficient method for printing circuits and antennas onto flexible substrates. The conductivity reached with the process in ambient conditions is above 1e6 S/m (above 1.5e7 S/m has been demonstrated), which is an adequate level of conductivity for many microelectronics applications to carry current without suffering from significant heating or voltage drop.

Further preferred embodiments of the invention are described below.

Nanoparticle inks developed for, e.g., printed electronics applications contain nano-scale particles capped with an encapsulating material forming a coating layer. According to a preferred embodiment, metallic nanoparticles with a mean particle diameter (typically) in the range 5-50 nm at a narrow size distribution are used as they will provide strong attractive van der Waals/Casimir forces so that only a small energy is required for displacing the particle encapsulant and for particle surfaces to get in contact. The contact formation between particles is further facilitated by the large surface-to-volume ratio of the particles; the melting/sintering temperature gets depressed due to the suppression of surface molecular vibrations. Preferably, the encapsulant material should have ionic terminating groups to provide electrostatic repulsion as a dispersion prior to printing. A non-ionic encapsulant material, such as PVP, can also be used, in which case stability is maintained by virtue of steric hindrance.

In order to form a conductor, the layer of capped metallic nanoparticles undergoes an insulator-to-metal-transition. Direct physical contact between the particles is possible when the encapsulating material is removed by breaking the encapsulant molecule—particle core bonds (normally via heating). Sintering takes place as the particles start showing neck formation (core-core coalencence causing elongation of the nanoparticles).

The driving force for sintering is the release of the high surface energy related to the small radius of curvature of the surface.

High conductivity is achieved through the formation of controlled perculation channels rather than through the complete collapse of the nanoparticles into bulk metal.

According to one embodiment, water facilitates the chemical removal of the encapsulating material. In the case of such a water-soluble encapsulating material, the method is carried out at a relative humidity of at least 10%, in particular at least 20%, preferably at least 40%, most suitably at least 75%.

All of the aforementioned ink and substrate properties are also preferred when making direct interconnection to discrete components from the printed layer; the electrical contact to the electrodes is indeed formed by the sintering of the nanoparticles by chemical removal of the encapsulating material.

EXAMPLES

The following examples demonstrate the invention with suitable commercially available nanoparticle inks and coated substrates.

Since inkjet printing substrates are engineered to provide fixation of the inks on the substrates, one could expect to have strong fixation also for some metallic nanoparticle ink formulations. For pigmented inks, fixation is obtained by the chemical reaction between the pigment coating and the surface layer of the substrate in a self-fixing manner. For the substrate facilitated removal of the encapsulating material of printed electronics inks/pastes, the affinity of the printing substrate for the capping material should be so strong as to break the encapsulating molecule—particle core bonds and release the particle cores into physical contact.

The results of the example tests presented here were conducted with Advanced Nano Products DGP-45LT-15C ink, which consists of silver nanoparticles with a nominal particle size of 10-20 nm and a triethylene glycol monoethyl ether (TGME) solvent (polar). A potential candidate for the encapsulating material is PVP. The PVP molecule will not provide stability in solution by means of electrostatic repulsion, but irreversible aggregation can be prevented by the steric hindrance provided by the polymer. Other work shows how PVP coated silver nanoparticles are stable in N,Ndimethylformamide (DMF) and ethanol, but coagulation occurs in water due to the larger polarity difference between DMF and water than between DMF and ethanolError! Reference source not found. Increasing polarity with water reduces the effectiveness of the stabilizer. Therefore, we may expect the environmental relative humidity (RH) to facilitate the sintering in tests conducted with DGP-45LT-15C.

We expect to witness significant differences between the sintering ability of different commercially available coated inkjet printing substrates (photopapers and transparency sheets). Although these substrates are all optimized for water-based inks and generally show similarly short dry-times, we know that the coating structure is in some cases fumed silica and in other cases e.g. colloidal alumina According to the preferred embodiment of the invention, a colloidal type oxide is preferred over a fumed oxide. Although the fumed oxide can produce fast solvent intake and immobilization of the pigments on the substrate surface layer, the fixation mechanism is more steric in nature than electrostatic. Consequently, according to the preferred embodiment of the invention, a colloidal type oxide, especially alumina oxide with a highly protonated substrate surface layer, is expected to most efficiently remove the encapsulating material from the silver nanoparticles.

Substrate Facilitated Sintering of Conductors

The in situ substrate facilitated sintering method is first demonstrated by inkjet printing silver nanoparticle ink (Advance Nano Products DGP-45LT-15C) onto Epson Inkjet Transparency sheet (S041063). The results are presented below. Thereafter, a second set of tests demonstrating the influence of relative humidity on the obtained conductivity ("sintering degree") is presented.

In the first tests, Silver nanoparticle ink (Advanced Nano Products DGP-45LT-15C) was printed onto three printing substrates: Siena 250 G, Epson Premium Glossy Photopaper and Epson Inkjet Transparency sheet. The patterning was printed using a commercial scale inkjet printer (Apollo II PSK with Spectra SX-128 head on iTi system: 10 pL droplet size, 128 nozzles, 50 um native resolution) at 100 mm/s head speed and 600 dpi printing resolution (FIG. 1). The printing trials were carried out in an ambient environment. Samples from each substrate type were also oven sintered for 10 min at 100° C. The resistance of untreated and post-cured (oven sintered) samples were measured (4-wire) and the corresponding sheet resistance was computed based on dimensions measured with an optical microscope.

Figure 2:
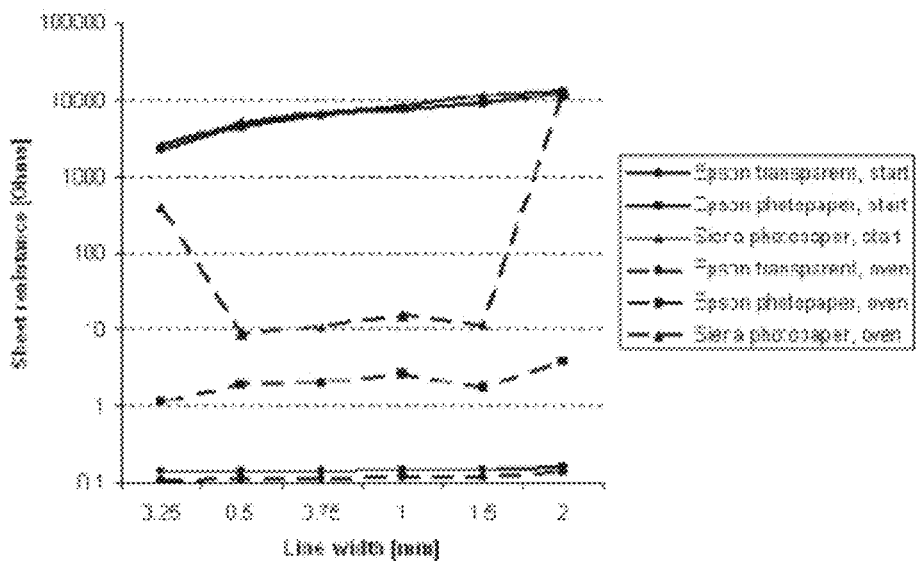
FIG. 2. Measured sheet resistance of printed wiring on inkjet substrates before and after oven curing for 10 min at 100° C.

Wiring printed onto Epson transparencies shows remarkably high conductivity already before any post-curing. Assuming 1 um layer thickness, the conductivity increased from 7e6 S/m to 1e7 S/m (11% to 16% relative to bulk silver) when thermally cured. The equivalent values for Siena and Epson Premium Glossy photopaper are 100 S/m before curing and 1e5 S/m (0.16% relative to bulk Ag) and 5e5 S/m (0.79% relative to bulk Ag) after oven curing (FIG. 2).

Figure 3:
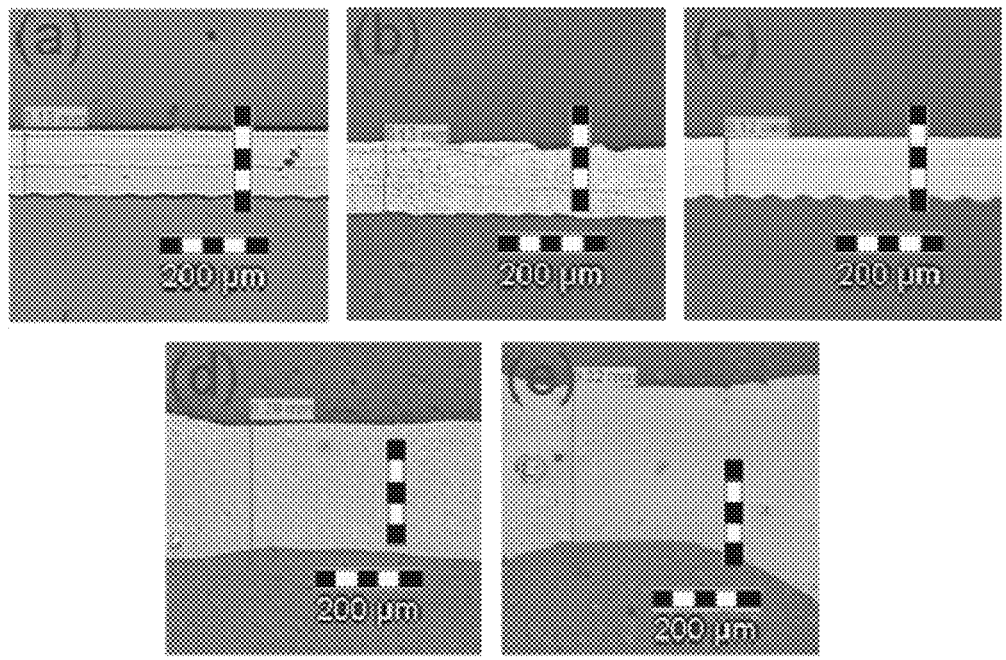
FIG. 3. Nanoparticle ink printed onto substrates stored at 25° C. and RH=25 . . . 35%. (a) Epson transparency (b) Epson DuraBrite photopaper (c) Siena photopaper (d) 3M transparency and (e) Star transparency.

The second set of test samples were printed (with DGP-45LT-15C ink) using the Autodrop Microdrop printer with 50 um nozzle, 60 um droplet spacing onto five different substrates: Epson inkjet transparency sheet, Epson DuraBrite photopaper, Siena photopaper, 3M inkjet transparency sheet and Star inkjet transparency sheet (FIG. 3). The experimental procedure was conducted as follows: the samples were inserted into controlled T/RH environment 3 days prior to printing (temperature held constant at ~25° C., RH varied RH:L=1 . . . 5%, RH:M=25 . . . 35%, RH:H=85%), all samples were exposed to RH~50%, T≈28° C. for a total time of 3-5 min during printing, and inserted back into controlled RH for 1 day before exposing to ambient conditions. All samples at ambient conditions 1 day prior to electrical measurements.

The Epson transparency, Epson DuraBrite and Siena printing substrates are dry-to-touch within 1-5 min while the 3M and Star transparency sheets take 5-20 min before the ink is fully absorbed. The 3M and Star transparency sheets showed poor printing quality and large variance in the measured conductivity.

Figure 4:
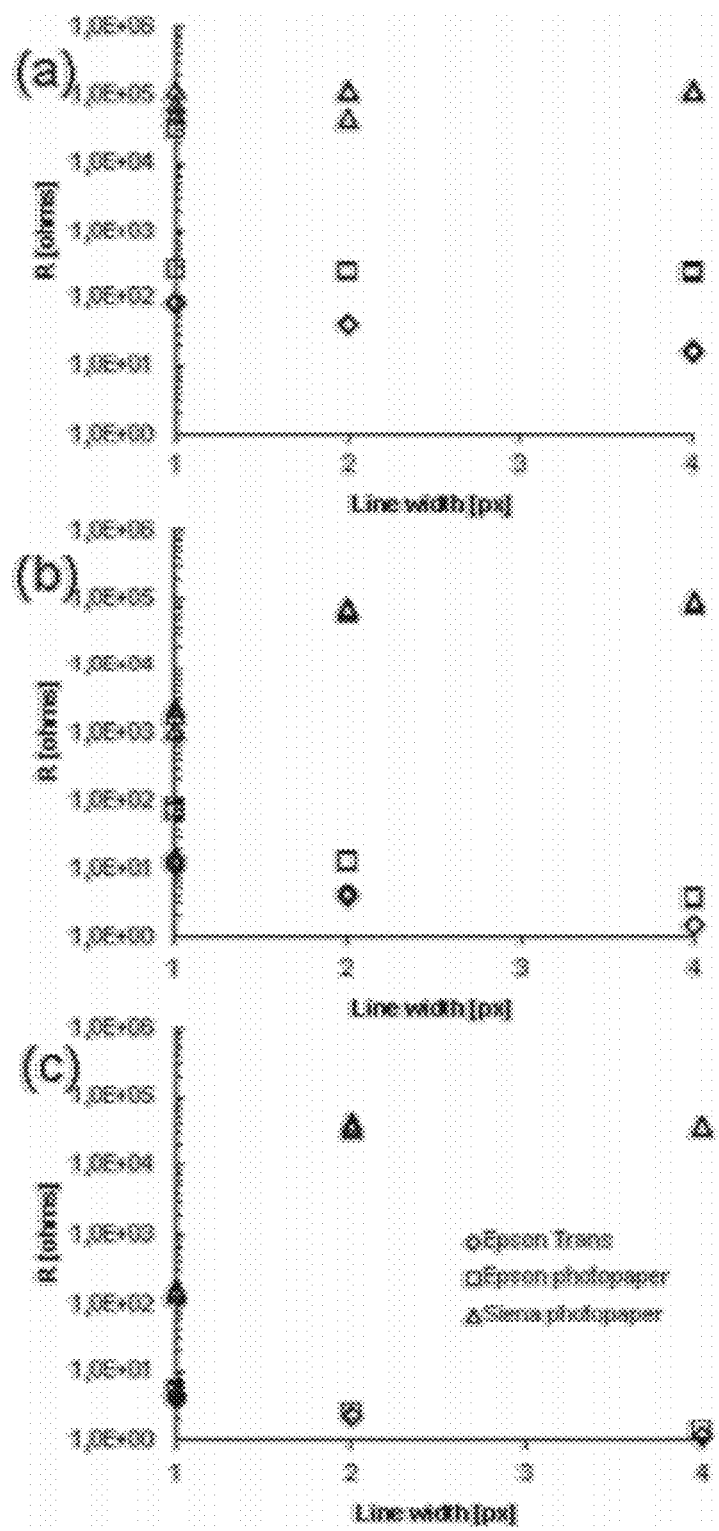
FIG. 4. Measured resistance (4-wire) of 5 mm long lines printed onto Epson transparency sheet, Epson DuraBrite photopaper and Siena photopaper substrates stored in controlled atmosphere at (a) RH:L=1 . . . 5%, (b) RH:M=25 . . . 35% and (c) RH:H=85%. Three samples of each line width/RH-value were measured. Exceptional repeatability demonstrated.
Figure 5:
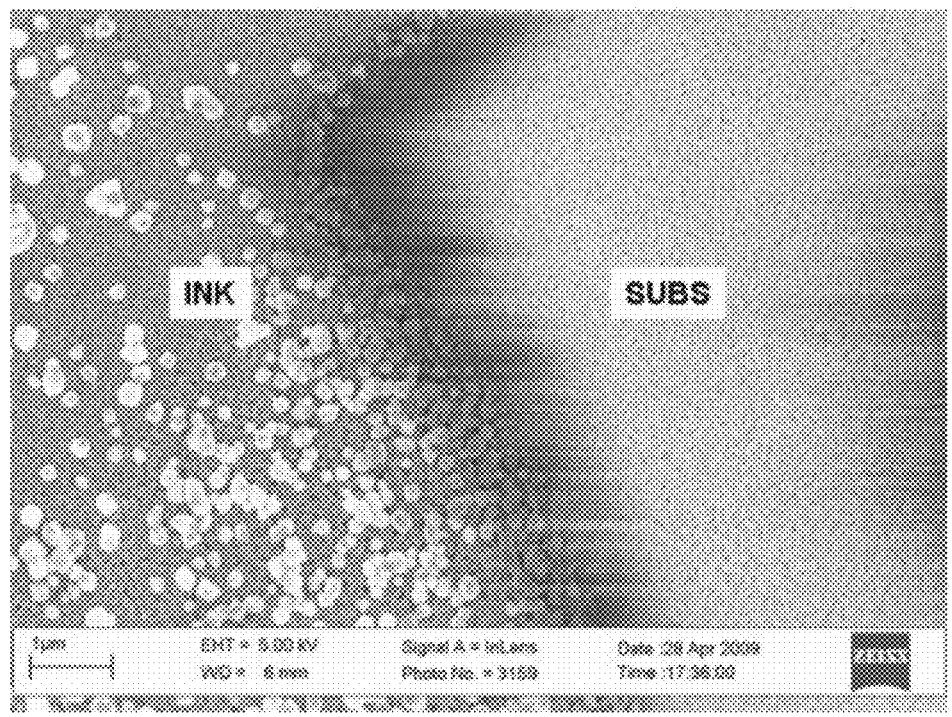
FIG. 5. SEM image of silver nanoink printed onto Epson transparency sheet: edge of 4 px wide line.
Figure 6:
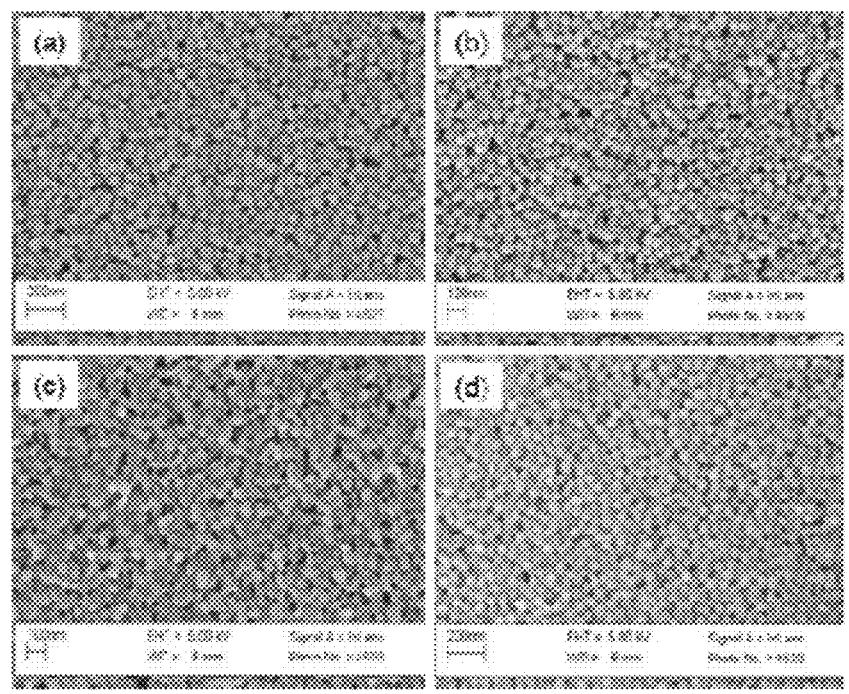
FIG. 6. SEM images from the centre of silver nanoink lines (4 px line width) printed onto Epson transparency sheet with (a) RH:L, (b) RH:M and (c) RH:H. Grain-growth is observed with increasing humidity. (d) The nanostructured top-layer coating of Epson transparency sheet is clearly particulate in nature.
Figure 7:
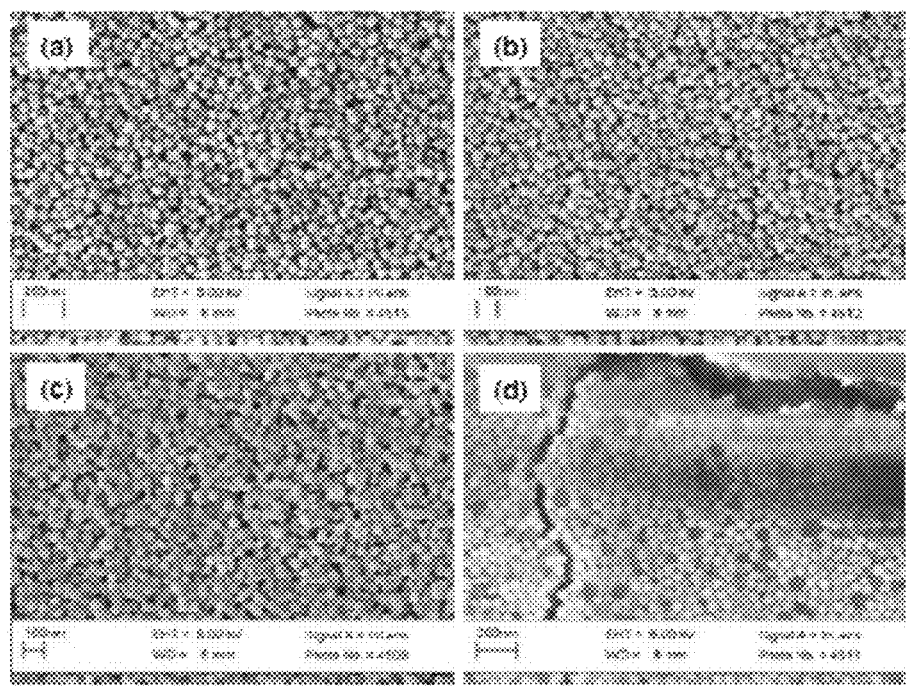
FIG. 7. SEM images from the centre of silver nanoink lines (4 px line width) printed onto Epson DuraBrite photopaper with (a) RH:L, (b) RH:M and (c) RH:H. Grain-growth observed with increasing humidity. (d) Epson DuraBrite photopaper has a dense nanoparticle top-layer coating, which showed cracking at micron length-scales at all RH levels.
Figure 8:
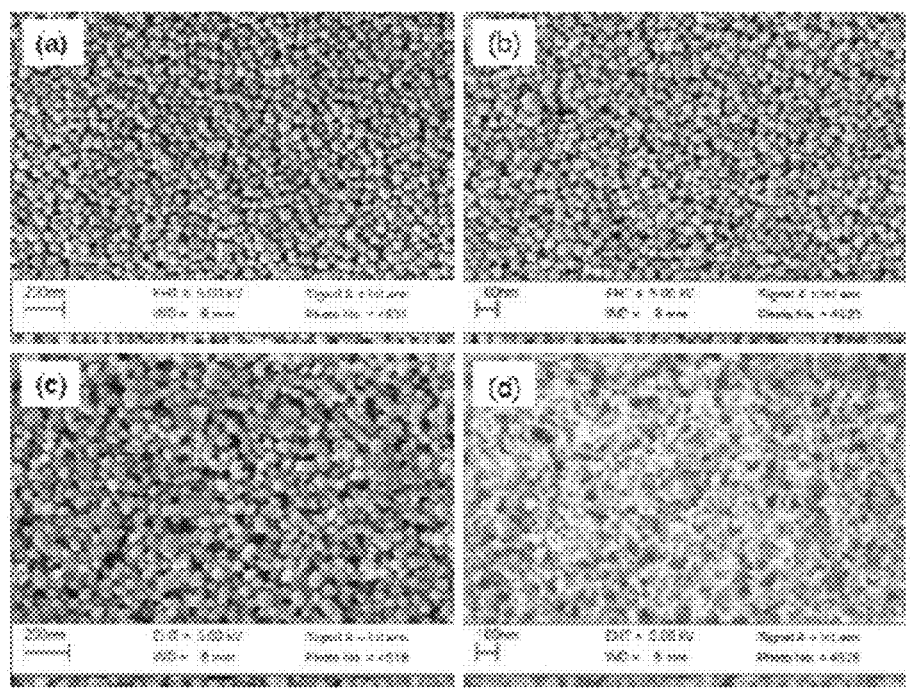
FIG. 8. SEM images from the centre of silver nanoink lines (4 px line width) printed onto Siena photopaper with (a) RH:L, (b) RH:M and (c) RH:H. Grain-growth observed with increasing humidity. (d) Siena photopaper appears to have nanoscale porosity, but the top-layer does not consist of nanoparticles.

The exposure to relative humidity did not affect the printing quality when printed onto the Epson substrates and Siena photopaper, but did enhance the conductivity. The measured resistance of the printed tracks gives best indication of resistivity per constant solid weight transferred onto the substrate (FIG. 4). The sheet resistance was computed and the conductivity is estimated in Table 1. Evidently, both the Epson transparency sheet and Epson DuraBrite photopaper stored at high RH provide incredibly high conductivity approaching that of bulk silver even though no post-curing has been applied.

TABLE 1

Bulk conductivity [S/m (% relative to bulk silver)] as a function of relative humidity and printing substrate

| RH [%] | Epson transparency | Epson DuraBrite | Siena |
|---|---|---|---|
| 1 . . . 5 | 1.0e6 (1.6%) | 1.3e5 (0.2%) | 3.7e2 |
| 25 . . . 35 | 8.3e6 (13.2%) | 1.9e6 (3.0%) | 5.0e2 |
| 85 | 1.7e7 (27.0%) | 1.4e7 (22.2%) | 1.2e3 |

SEM imaging was carried out after the electrical measurements. The results for the Epson substrates and Siena photopaper are shown in FIGS. 5-8.

According to the SEM images, variation of RH did not affect the surface structure of the printing substrates.

Increasing RH further improved the obtained conductivity. The RH-dependent increase in conductivity was almost 1 order of magnitude for the Epson transparency sheet and over 2 orders of magnitude for the Epson DuraBrite photopaper. SEM images clearly show grain growth in the nanoparticle layer with increasing RH.

The witnessed RH dependence on conductivity suggests that water facilitated the removal of the ligand, but we cannot deduce whether water had effect before printing (altered the chemistry of the substrate) or afterwards (reaction with the top surface and edges of the ink layer), or both. If the latter case holds (which is supported by the SEM images), it is reasonable to conclude that the DGP-45LT-15C has a water soluble ligand.

Similar tests have also been conducted using ANP DGP-55HTG, which has a smaller nominal particle size, but a more tightly bound encapsulating ligand. The n-tetradecane solvent is non-polar.

The DGH-55HTG provided a sheet resistance of roughly 5 kΩ/sq on the Epson transparency sheet and 20 kΩ/sq on Epson DuraBrite photopaper while the 3M and Star transparency sheets remained non-conductive. All measurements were conducted at least 24 h after dispensing and no post-curing step was implemented.

In summary, a good printing result was obtained on the Siena photopaper, Epson Premium Glossy photopaper, Epson DuraBrite photopaper and Epson transparency sheet. Very good conductivity obtained with Epson transparency sheet and Epson DuraBrite photopaper by direct printing at ambient environment. However, over 5 orders of magnitude difference in conductivity between Epson Glossy photopaper and Epson DuraBrite photopaper (printed with the same printing parameters and environment) proving how large differences there are between glossy photopapers even when provided by the same manufacturer. The Epson DuraBrite photopaper is optimized for particulate pigmented inks while the Epson Glossy photopaper is targeted for dye-type inks.

The SEM images reveal that the Epson transparency sheet and Epson DuraBrite substrates (the ones providing the highest conductivity) provide a surface layer of colloidal nano-sized particles.

A noticeable difference observed was the longer dry-time of the ANP DGH-55HTG ink on the Epson transparency sheet and DuraBrite substrates in comparison to DGP-45LT-15C. This is due to the substrates being optimized for a polar-type ink dispersant.

Direct Interconnection of Discrete Components

Figure 9:
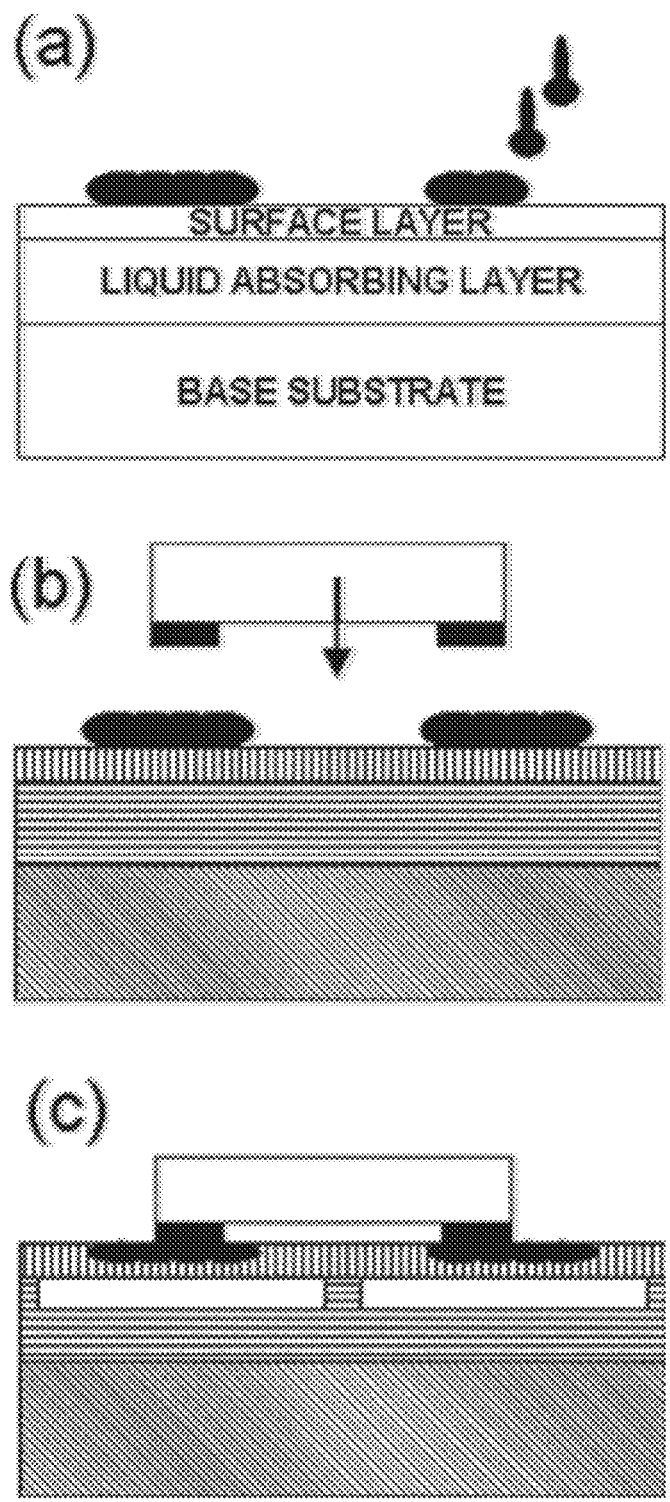
FIG. 9. Schema representing the invented interconnection procedure. (a) Nanoparticle ink electrodes are printed onto the substrate at high resolution. (b) The component is placed on the printed electrodes when the ink is still wet such that the ink wets the component's contact electrodes. (c) The ink is instantaneously absorbed when the chip is brought into contact and a high quality contact is formed. The solvent is fully absorbed into the underlying liquid absorbing layer.

The interconnection method is demonstrated by printing contact pads for surface mount resistors (types 0805 and 0603) on the different substrates and placing the resistors on the pads when the ink was still wet. The ink and printing parameters are the same as in the second tests except that the droplet spacing was set to 50 um for wiring and 35 um for contact-pad areas. The interconnection method invented is schematically presented in FIG. 9.

A good electrical contact between the electrodes of a discrete component and the printed wiring was obtained in particular with the Epson DuraBrite and Epson transparency sheet.

The formed interconnection with the Epson transparency sheet has lower mechanical strength.

Figure 10:
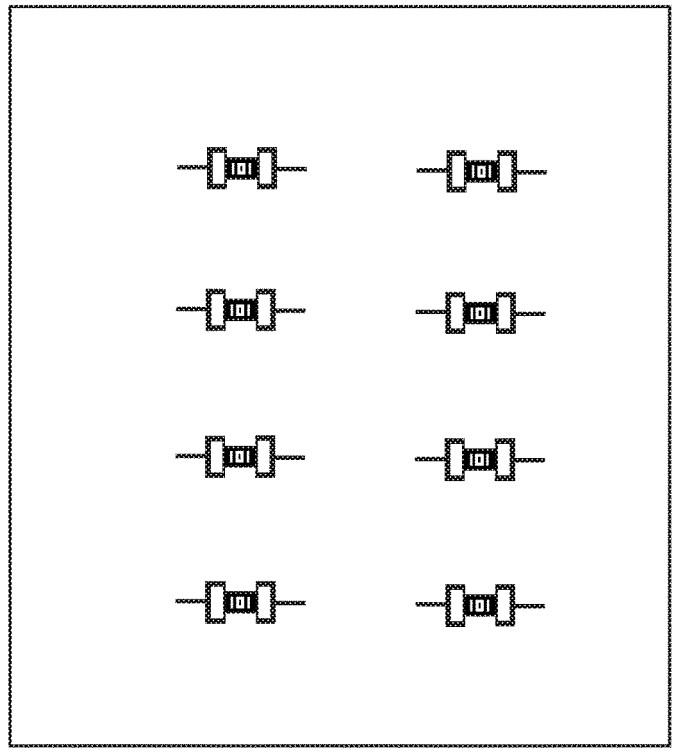
FIG. 10. Surface mount chip resistors connected to electrodes printed on Epson DuraBrite photopaper.
Figure 11A:
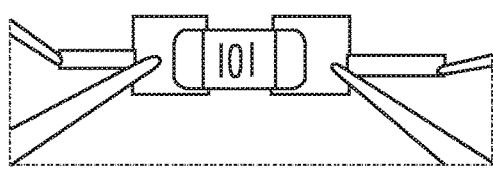
FIG. 11. Surface mount chip resistors connected to printed electrodes (Epson DuraBrite). (a) type 100Ω 0603, measured R=102Ω. (b) type 10 kΩ 0805, measured R=10 kΩ.
Figure 11B:
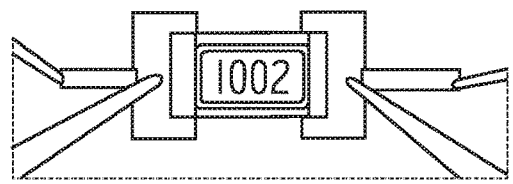

The interconnection obtained on the Epson DuraBrite photopaper provides excellent mechanical strength in addition to low contact resistance as shown in FIG. 10 and FIG. 11.

Figure 12:
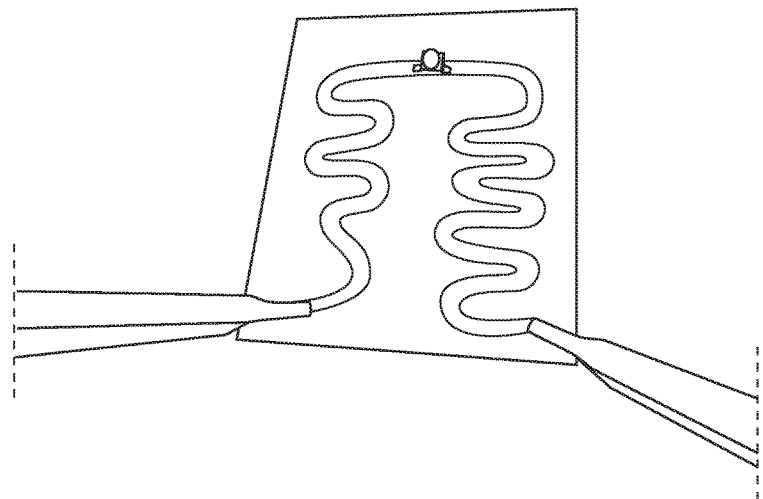
FIG. 12. Surface mount LED interconnected to wiring or Epson DuraBrite photopaper. The wiring and interconnection were formed by moving a pipette across the substrate and placing the LED over still partially wet nanoink electrodes.

In addition to success in interconnections to chip resistors, the method is demonstrated with a surface mount LED as shown in FIG. 12.

The similar printing and placing process was attempted with the Siena photopaper and the Star and 3M transparency substrates, but without success. The ink is wetted below the chip and provides no mechanical strength or electrical contact whatsoever.

Since the dry-time of the ink is roughly the same with the Epson DuraBrite photopaper and Siena photopaper, it is concluded that the absorbability of the substrate is not the enabling factor for the said direct interconnection method.

The invention presented here provides an efficient method for printing circuits and antennas onto flexible substrates. The conductivity reached with the process in ambient conditions is above 1e6 S/m (above 1.5e7 S/m was demonstrated with Epson transparency sheets at room temperature), which is an adequate level of conductivity for many microelectronics applications to carry current without suffering from significant heating or voltage drop. Furthermore, by tuning the ink and substrate coating layer properties to obtain an even better match, the obtained conductivity can be further improved.

The coating layer structures discussed in this invention are commercially available as ready substrates or as solution for e.g. spin coating onto various base substrates. Many base materials, such as paper, plastics, textiles etc. can be coated with this type of acceptor coating layer. These materials are also relatively inexpensive when compared to uncoated substrates frequently used in printed electronics: e.g. the Epson transparency sheet costs around 1.3-1.7 €/piece (when purchased as a package of 30 sheets, A4 size) whereas e.g. Kapton (polyimide) costs 12.6 €/piece (25 sheet package, A4) and Mylar A (PET) costs 3.9 €/piece (25 sheet package, A4).

This invention also presented a method for the direct interconnection of discrete components onto the printed wiring. The problem related to the insulating polymer layer that tends to form on the top surface of sintered conductors is overcome with the substrate facilitated sintering of this invention.

Figure 13:
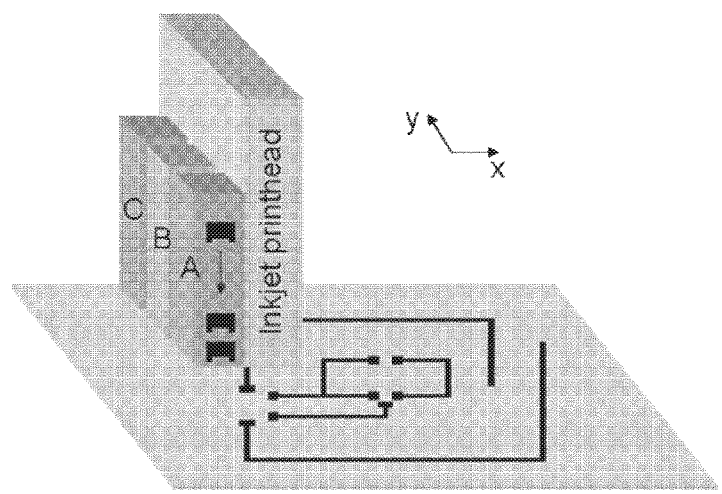
FIG. 13. Setup for drop-on-demand printing of circuit wiring and place-on-demand interconnection of discrete components.

FIG. 13 presents a possible practical realization of the printing and interconnection method. A high-throughput inkjet print head is used to print (and in situ sinter) the basic wiring for an electric circuit. The discrete circuit components are located in "feed towers", where each tower holds one component type (A, B, C, etc.). The components are placed in a place-on-demand fashion by first printing the contact pad areas at a slightly higher printing resolution than was used for the conductor patterning, and then dropping the component in the defined location by a momentary break in the vacuum suction flow holding the components in the tower. As the component contacts the wet ink, the component is instantaneously fixed to the electrodes providing an electrically and mechanically high quality contact. The placement accuracy is limited only by the accuracy of the printer's motorized stages.

This invention provides a method to print even large-scale circuits onto low-cost flexible substrates at high speed. The mechanical strength of the interconnection can be increased with glue and the risk of shorting the printed pads when the component is attached, can be minimized by using an anti-wetting agent such a fluorochemical acrylate polymer (e.g. Novec EGC-1700 manufactured by 3M). Thus, the interconnection process could be further optimized: before releasing the component from the tower, a solution with glue and anti-wetting properties could be printed on the substrate in the area between the printed contact pads.

The invented method of removing the encapsulating material is also expected to facilitate the low temperature/energy sintering of semiconductor and/or metal oxide nanoparticles. Namely, the method described in this invention may be used as complementary to other sintering methods. In this case, the method would provide significant benefits in the processing of printed OLEDs, photovoltaics, diodes and transistors.

The invention has already been demonstrated on commercially available coated substrates.

Although the invention has been demonstrated using commercially available nanoparticle ink and coated substrates, more general definitions of the starting material are justified and proposed. Well-defined conductor patterns were inkjet printed onto the substrates with the resulting conductivity above 25% that of bulk silver when printing (and in situ curing) was carried out at room temperature.

With the optimal ink-substrate combination, a mechanically strong interconnection with interconnection resistance less than 2 Ohms was obtained.

The present method can be used for producing high-throughput printed electronics structures (e.g. RFID antennas, memory cards, sensor platforms etc) with a more cost-effective discrete component attachment method for flexible printed circuits.

The invention claimed is:

1. An electronics module comprising
    a substrate, and
    a sintered structure on said substrate, the sintered structure being formed from at least partially fused nanoparticle cores made of conductive or semiconductive material, said sintered structure forming at least part of a conductive pattern for an electronic circuit of said electronics module,
wherein said substrate is capable of chemically removing at least one encapsulating ligand bonded to and serving as encapsulating material of said nanoparticle cores prior to said fusing, in order to at least partially sinter the nanoparticles to form and to functionalize said sintered structure.

2. The electronics module according to claim 1, wherein the substrate comprises a charged surface layer.

3. The electronics module according to claim 1, wherein the substrate comprises a charged oxide-containing surface layer.

4. The electronics module according to claim 3, wherein the substrate comprises a charged colloidal porous or mesoporous oxide-containing surface layer.

5. The electronics module according to claim 1, wherein the substrate comprises alumina or silica particles having an average size between 5 and 40 nm, binder for a polar solvent, and cationic additive for facilitating fixation of the nanoparticles.

6. The electronics module according to claim 1, wherein the substrate comprises a first layer capable of absorbing solvent and a second surface layer capable of retaining nanoparticles.

7. The electronics module according to claim 1, further comprising a discrete component electrically connected to said sintered structure and mechanically affixed to the substrate.

8. The electronics module according to claim 1, wherein it is a printed electronics module.

9. The electronics module according to claim 1, wherein the nanoparticles cores are made of a metal, a metal oxide, or a semiconductor.

* * * * *